United States Patent [19]

Westell

[11] 4,385,839
[45] May 31, 1983

[54] AUTOMATIC ALIGNMENT SYSTEM

[75] Inventor: William E. Westell, Weston, Mass.

[73] Assignee: Baird Corporation, Bedford, Mass.

[21] Appl. No.: 173,997

[22] Filed: Jul. 31, 1980

[51] Int. Cl.³ .............................................. G01B 11/00
[52] U.S. Cl. ..................................... 356/400; 356/363
[58] Field of Search ................................ 356/373–375, 356/395, 400–401, 358, 363; 350/3.81–3.82; 250/237 G

[56] References Cited

U.S. PATENT DOCUMENTS

| 3,859,460 | 1/1975 | Westell | 178/72 |
| 3,867,038 | 2/1975 | Westell | 356/172 |
| 3,951,548 | 4/1976 | Westell | 356/4 |
| 4,153,371 | 5/1979 | Koizumi et al. | 356/400 |

OTHER PUBLICATIONS

W. E. Westell, "Precision Fire Control Enhancement . . . ", Paper presented at Aircraft & Combat Vehicle . . . Symposia, Nov. 1977.
Baird Corp., Final Technical Report, "Scan/Target Tracker for XM-65 . . . ", dated Apr. 6, 1978.
Baird Corp., Tech. & Mgmt. Proposal, "Installation & Field Test Support . . . ", #180-1320-A, Jan. 1980.
Paper presented at Institute of Navigation, 21-22 Apr. 1966, by W. E. Westell, "High Precision System Motion Society . . . ".
Baird-Atomic Brochure, "Advanced Former Transform Trading", ("Swat." Helicopter for Control).
Baird-Atomic, Final Report dtd. Nov. 30, 1971 on B/A Project, No. 5395-01
Baird Corp. Technical Proposal #679-1302, Jun. 1979.
Baird-Atomic, Solicited Proposal #575-1124, dated May 27, 1975.
Baird-Atomic, Final Tech. Rep., "Bat.-ARDOR Flyable Duel-Axis Prototype Trailer . . . ", dtd. May 7, 1976.
Arecchi et al., "MTF Measurement Via Diffraction Shearing with Optically Superimposed Gratings", App. Optics, 4-15-79, pp. 1247-1248.

*Primary Examiner*—William H. Punter
*Attorney, Agent, or Firm*—More, Altman & Dacey

[57] ABSTRACT

An electro-optical device for generating data signals representing relative displacement between a master reticle with an optical aperture pattern in an object plane and a workpiece with an image of the aperture pattern in an image plane comprises a reference detector for sensing reference radiation directed towards the aperture pattern and a convolution detector for sensing the reference radiation reflected by the image pattern. A processor compares the phase of a signal generated by the convolution detector to the phase of a signal generated by the reference detector and generates the data signals defining the relative displacement between the master and the workpiece.

11 Claims, 9 Drawing Figures

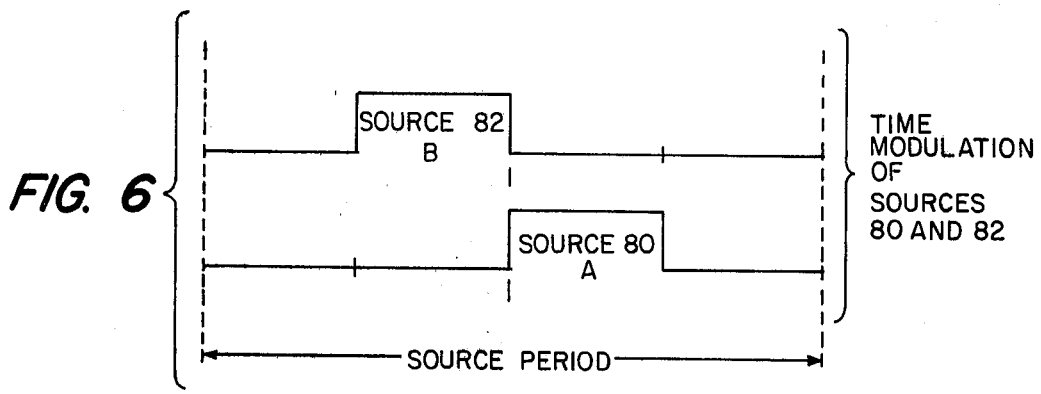
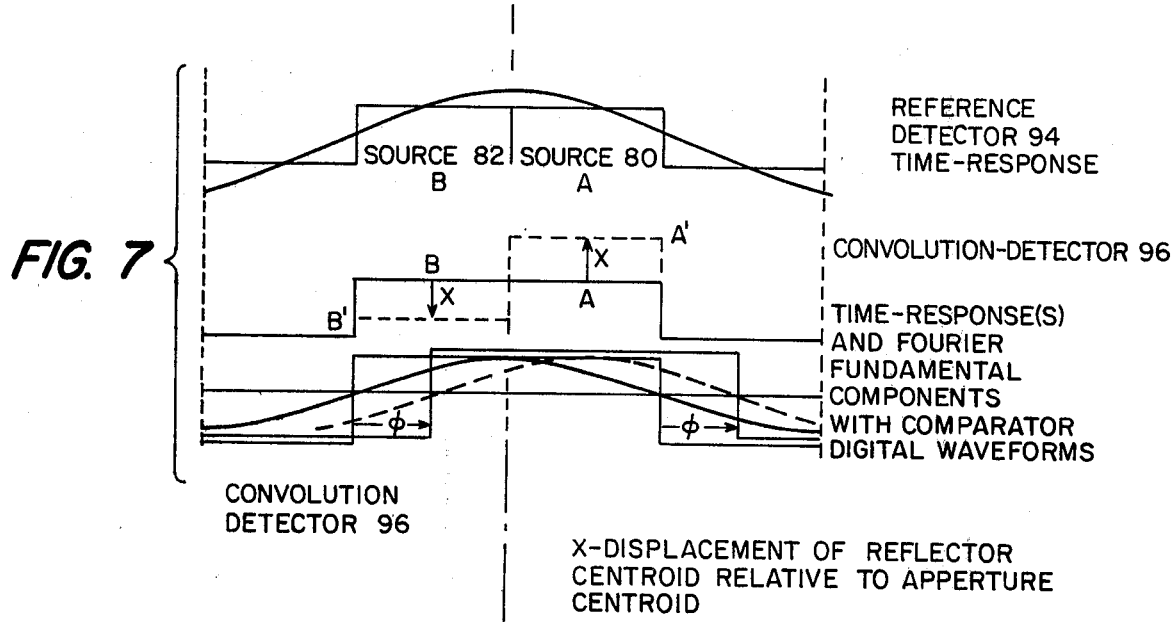
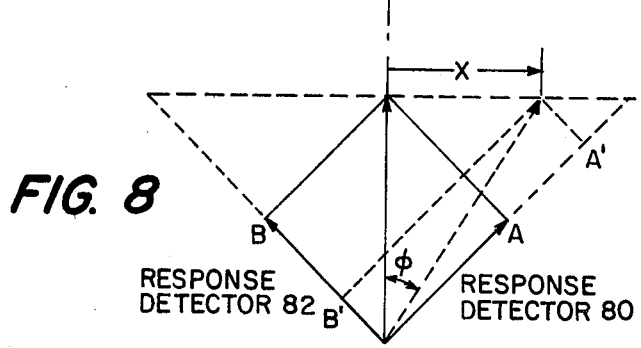

AUTOMATIC ALIGNMENT SYSTEM

BACKGROUND OF THE INVENTION

1. Field of Invention

The present invention relates generally to alignment systems and, more particularly, is directed towards electro-optical alignment systems.

2. Description of the Prior Art

Manufacturing processes, such as those involving graphic arts, integrated circuits, printed circuit boards and assembly systems, require precise alignment among various components. Manual alignment systems are too time consuming and are subject to human error. Automatic alignment systems have been met with limited success primarily because they make indirect measurements relative to secondary references. Alignment systems of the type disclosed in U.S. Pat. Nos. 3,867,038 and 3,951,548 suffer from limitation that they are suitable only for closely spaced objects. A need exists for an improved electro-optical alignment system for alignment of objects that are not closely spaced.

SUMMARY OF THE INVENTION

It is an object of the present invention to provide an improved electro-optical alignment system which does not suffer from the limitations and disadvantages of prior art electro-optical alignment systems. The present invention features an electro-optical alignment system which generates data signals defining the relative displacement between a master reticle in an object plane and a workpiece in an image plane. The master is provided with an optical aperture pattern and the workpiece is provided with an image of the optical aperture pattern. The electro-optical system comprises a reference detector for sensing reference radiation directly from the aperture pattern and a convolution detector for sensing the reference radiation reflected from the image pattern. Signals generated by the reference detector and convolution detector represent the relative spatial displacement between the aperture pattern and the image pattern.

These relative spatial displacements signals are converted to temporal waveforms having periodic phase time relationships linearly related to the relative spatial relationships between the aperture and image patterns. A processor compares the phase of the signal generated by the convolution detector to the phase of the signal generated by the reference detector and generates data signals defining the relative displacement between the master reticle and the workpiece.

A further object of the invention is to provide inherent correction for optical aberrations of optical relay systems and for time varying misalignments caused by mechanical vibrations, strains and temperature variations.

Other objects, features and advantages of the present invention will become more apparent after considering the following detailed disclosure.

The invention accordingly comprises the system possessing the construction, combination of elements, and arrangement of parts that are exemplified in the following detailed disclosure, the scope of which will be indicated in the appended claims.

BRIEF DESCRIPTION OF THE DRAWINGS

For a fuller understanding of the nature and objects of the present invention, reference should be had to the following detailed description taken in connection with the accompanying drawings, wherein:

FIG. 6 is a series of waveform illustrating the time modulation of the radiation sources of FIG. 3;

FIG. 7 is a series of waveforms illustrating the responses of the reference detector and convolution detector of FIG. 3; and FIG. 8 is a vector representation of the fundamental Fourier component of the reference and convolution detectors responses of FIG. 7.

DETAILED DESCRIPTION OF THE PREFERRED EMBODIMENT

The electro-optical and electronic processing techniques of the present invention are based on the Fourier analysis theorem which states that a periodic waveform is fully described by two quadrature samples. In the present invention, quadrature samples in space are transformed by time modulation and interpolation into waveforms in time which are equivalent to those produced by a moving reference reticle. The encoding principles involved in the present invention are illustrated by the following description in which the relative spatial displacements between an optical aperture pattern on a master and an image of the optical pattern on a device to be processed are converted to temporal waveforms having periodic phase or time relations linearly related to their relative spatial relationships.

Figure 1:
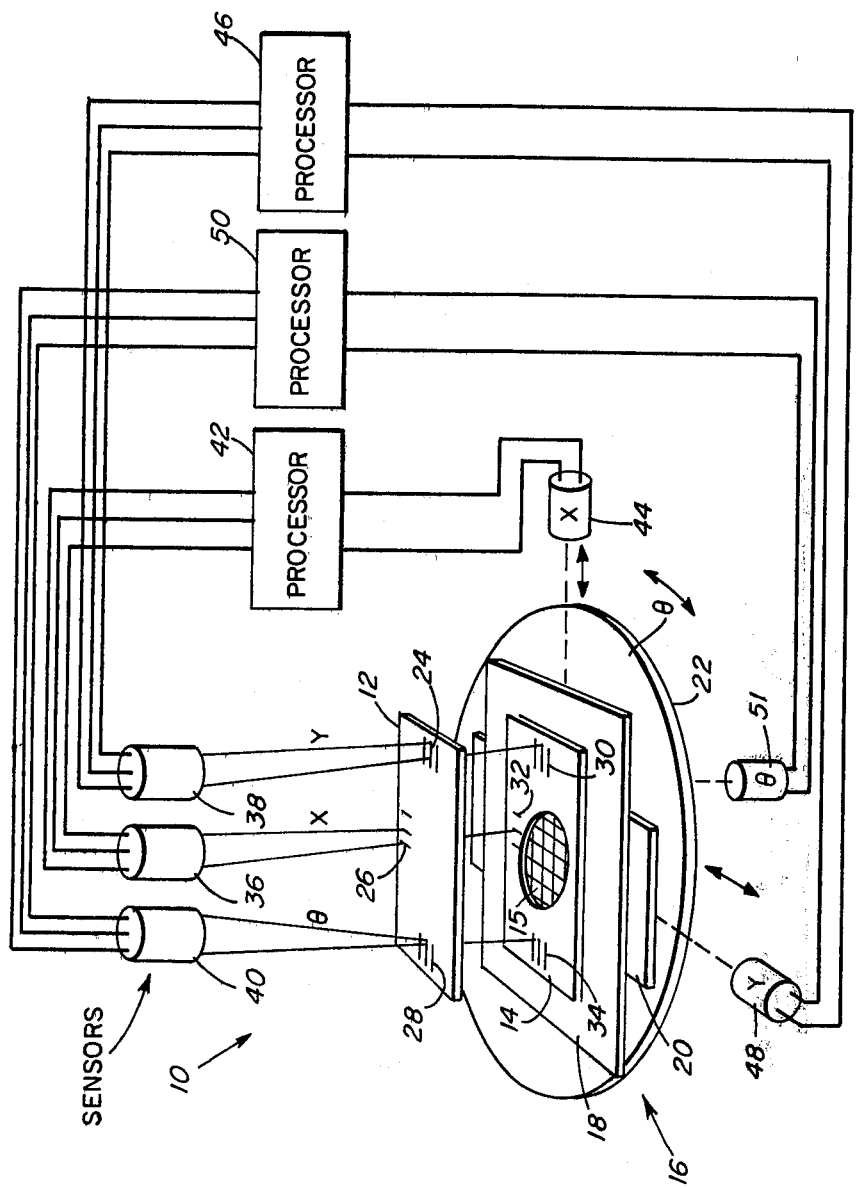
FIG. 1 is a schematic representation of a linear scan electro-optical system embodying the invention.
Figure 2:
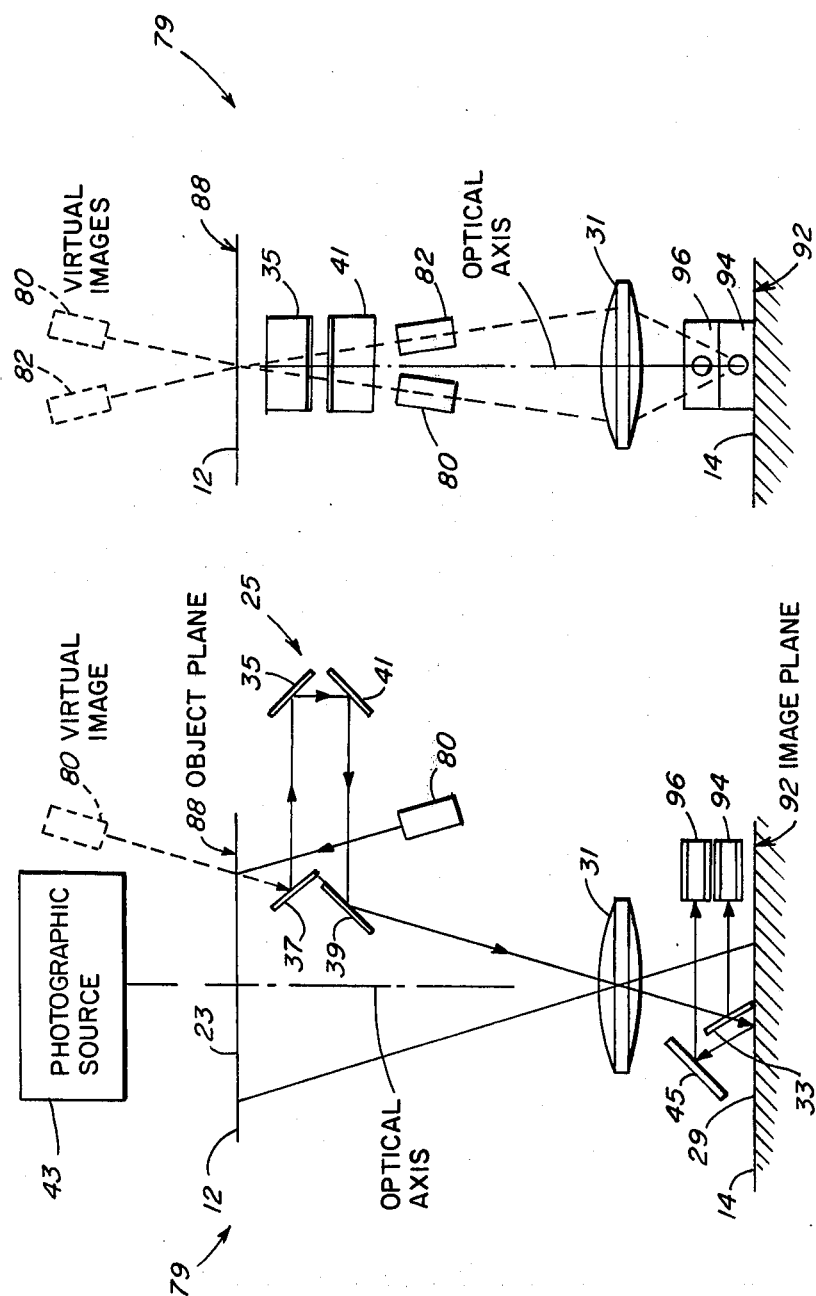
FIG. 2A is a schematic representation of one axis of the electro-optical system of FIG. 1.
FIG. 2B is a side view of the schematic representation of FIG. 2A.

Referring now to the drawings, particularly FIG. 1, there is shown, by way of example, a three axis optical alignment system 10 for alignment of a workpiece 14 relative to a master reticle 12. Workpiece 14, for example, a wafer of semiconductor devices 15, is mounted on an XY$\theta$ table 16 having movable platforms 18, 20 and 22. Platform 18 is adapted for transverse movement in an X direction, platform 20 is adapted for transverse movement in a Y direction, and platform 22 is adapted for rotational movement in a $\theta$ direction. Master 12 is provided with an optical aperture pattern 23 having reticles 24, 26 and 28, and wafer 14 is provided with an image of the aperture pattern in the form of a reflective image pattern 29 having reticles 30, 32, and 34, reticles 24 and 30 define a first reticle radial pair, fixed reticles 26 and 32 define a second radial reticle pair, and fixed reticles 28 and 34 define a third reticle radial pair. Radial reticle lines of off-axis patterns avoid offsets of sagittal spread function. The first and third reticle pairs include equally spaced bars disposed in spaced parallel relationship to the X axis and the second reticle pair includes equally spaced bars disposed in spaced parallel relationship to the Y axis. As hereinafter described, the first reticle pair provides transverse displacement data relative to the Y axis alignment of master 12 and wafer 14; the second reticle pair provides transverse displacement data relative to the X axis alignment of master 12 and wafer 14; and the third reticle pair provides rotational displacement data relative to the θ alignment of master 12 and wafer 14.

The Y axis displacement data, the X axis displacement data and the θ displacement data are detected by sensors 36, 38 and 40, respectively. Sensor 36 is connected to a processor 42 which generates command signals for controlling a motor 44 operatively connected to platform 18, sensor 38 is connected to a processor 46 which generates command signals for controlling a motor 48 operatively connected to platform 20, and sensor 40 is connected to a processor 50 which generates command signals for controlling a motor 51 operatively connected to platform 22. The energy generated by the convolution aperture pattern 23 and image pattern 29 is transduced by radiometric detectors into electrical signals having characteristic frequencies defining the relative displacement between master 12 and wafer 14. Processors 42, 46 and 50 process the electrical signals and generate command signals for positioning platforms 20, 18 and 22, respectively. Specular reflections from master 12 and wafer 14 are used for maximum signal to noise ratio.

Figure 3:
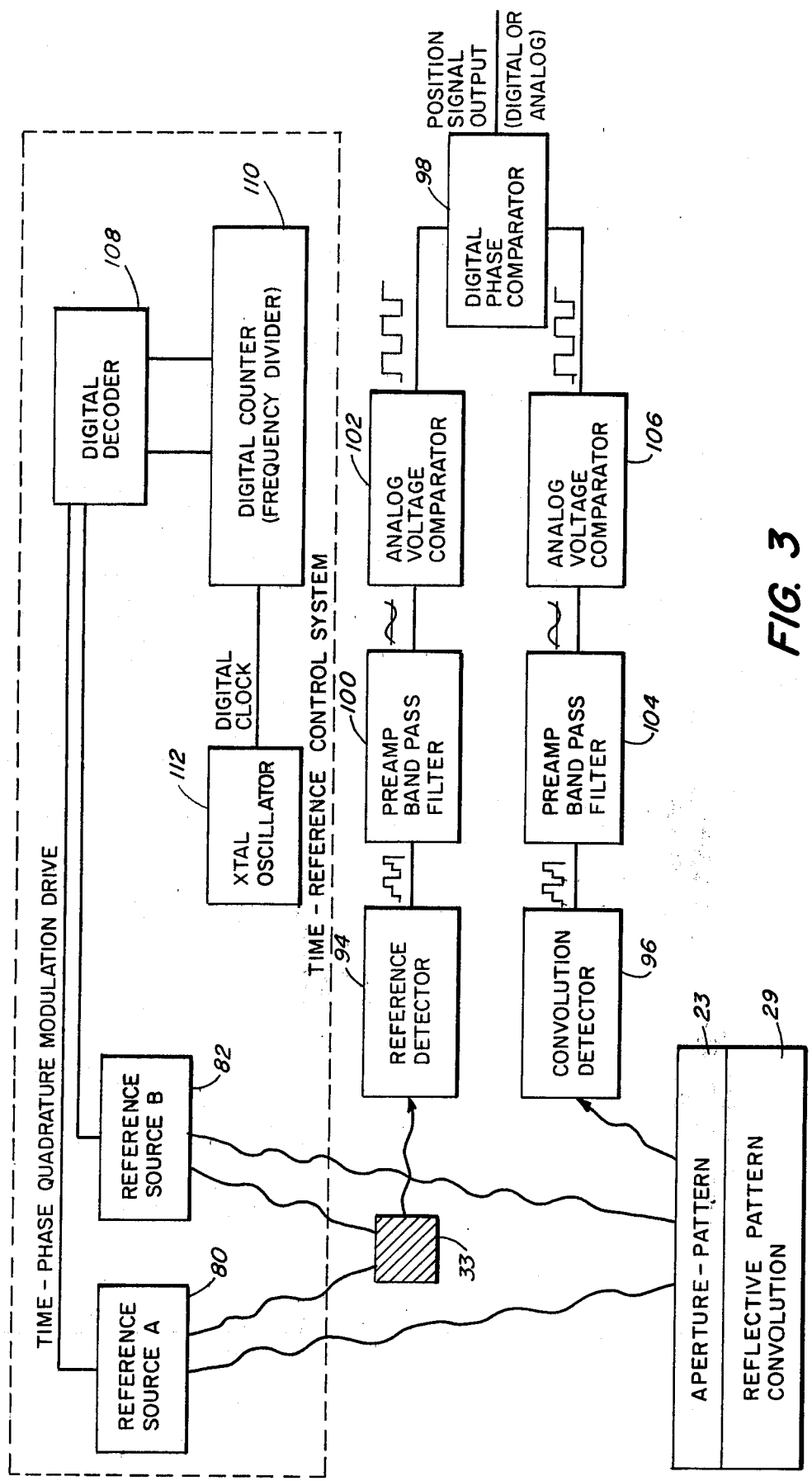
FIG. 3 is a block and schematic diagram of the electro-optical system of FIG. 1.
Figure 4:
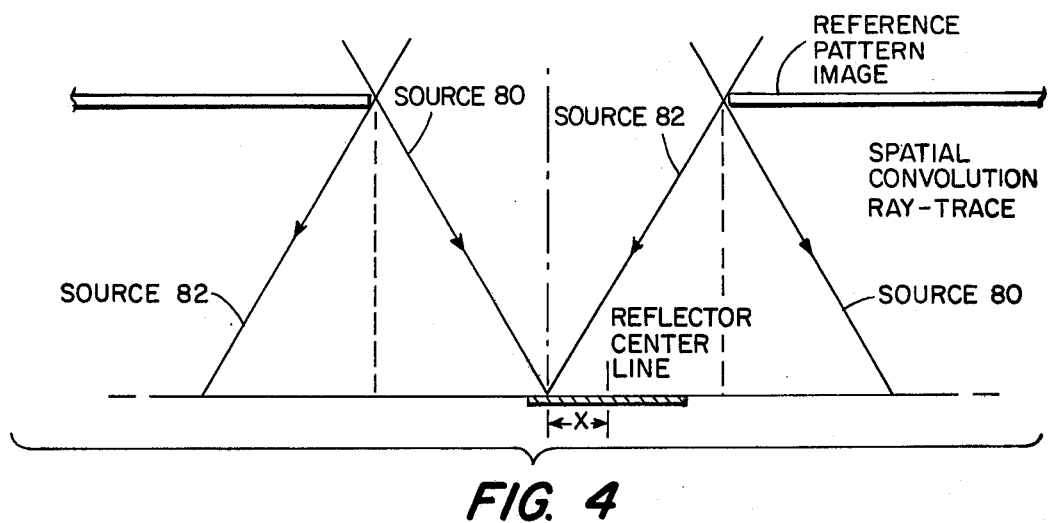
FIG. 4 is a schematic representation of the spatial convolution ray trace of the system of FIG. 3.
Figure 5:
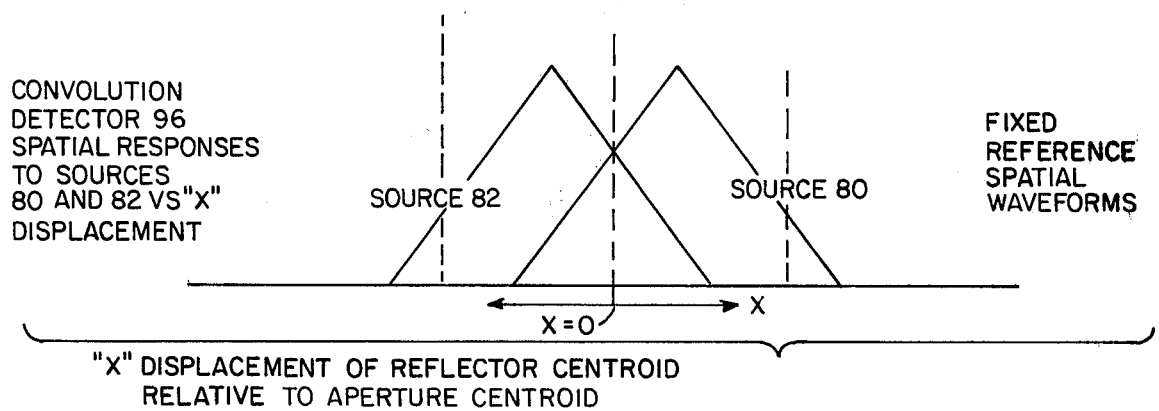
FIG. 5 is a series of waveforms illustrating the spatial responses of the convolution detector of FIG. 3.

Referring now to FIGS. 2-8, there is shown a fixed reference Fourier vernier electro-optical system 79 embodying the invention and illustrating the concept of Fourier analysis applied to spatial-temporal transformation such that no moving parts are required. As shown in FIGS. 2A, 2B and 3, the effect of a moving reference source is produced by two fixed reference sources 80 and 82 which are positioned so as to produce reference signals which are in convolution space quadrature with respect to the reference patterns. The equivalent temporal relationships are provided by time-phase quadrature electrical modulation of the two fixed references sources 80 and 82, for example light emitting diodes. The spatial-temporal quadrature relations, FIGS. 4-8, are the Fourier-analytical equivalent of a phase-locked spatial-temporal reference source scan.

Illumination emitted by light emitting diodes 80 and 82 pass through a path lengthening assembly 25 and is directed towards apertures 23 in an object plane 88 and reflective pattern 29 in an image plane 92 via a reduction lens 31 and a beam splitter 33. Assembly 25 lengthens the optical path in order to locate the virtual image of aperture pattern 23 above object plane 88. In one embodiment, assembly 25 includes reflectors 35, 37, 39 and 41, for example mirrors. In alternative embodiments, assembly 25 is other than reflectors, for example an optical plate composed of an optical material having a non-unity index of refraction bounded by substantially parallel plane surfaces which are nominally perpendicular to the sensing light rays. Placement of the virtual image of aperture pattern 23 above object plane 88, as hereinbefore described, permits parallax modulation by light emitting diodes 80 and 82. Path lengthening assembly 25 is moved out of the way only when aperture pattern is to be exposed on workpiece 14 by means of a photographic source 43 and reduction lens 31. A portion of the illumination emitted by light emitting diodes 80 and 82 and passing through periscope assembly 25 is directed by beam splitter 33 towards a reference detector 94 directly and another portion is directed by beam splitter 33 towards reflective pattern 29. The reference illumination is sensed by reference detector 94 and the reflected illumination is sensed by a convolution detector 96. Reference sources 80 and 82 are disposed in a plane which is normal to the plane of the longitudinal axis of reference detector 94 and lie along a line which is normal to apertures 23 and reflectors 29. Convolution detector 96 is positioned along a line which is perpendicular to the center of a line drawn between reference sources 80, 82 and which intersects the center of one of the apertures 23. Periscope assembly 25 directs the rays from reference sources 80, 82 towards beam splitter 33. Certain rays are reflected by beam splitter 33 towards reference detector 94. Certain other rays pass through beam splitter 33 and are directed towards reflective pattern 29. Rays reflected by reflective pattern 29 are directed towards convolution detector 96 by a mirror 45. Reference detector 94 and convolution detector 96 are in a plane which is parallel to the longitudinal axis of apertures 23 and reflectors 29. Fixed reference sources 80 and 82 radiate reflective pattern 29 through the apertures 23 such that their radiation convolution which produce the convolution detector 96 responses are in space quadrature with respect to the reflector centroid position relative to the aperture centroid position as shown by the ray traces and spatial convolution waveforms of FIGS. 4 and 5, respectively.

The illumination emitted by fixed reference sources 80 and 82 is directed towards reference detector 94 in such a manner that the reference detector 94 receives radiation from reference sources 80 and 82 in the same relative proportions as that directed towards reference apertures 23 as to provide complete immunity from normal variations of reference source intensities. Beam splitter 33 prevents any image plane 92 radiation reflections from being seen by reference detector 94 and further prevents any reference reflector 84 radiation reflections from being seen by convolution detector 96 so as to avoid mixing of reference and convolution radiation signals is avoided.

The signal at the output of reference detector 94 is applied to a digital phase comparator 98 via a bandpass filter 100 and an analog voltage comparator 102. The signal at the output of convolution detector 96 is applied to digital phase comparator 98 via a bandpass filter 104 and an analog voltage comparator 106. Bandpass filters 100 and 104 operate to remove the DC and harmonic content of the signals generated by reference detector 94 and convolution detector 96, respectively. The signal at the output of digital phase comparator 98 is a displacement signal representing the relative displacement between apertures 23 in object plane 88 and reflectors 29 in image plane 92. The resultant time quadrature modulation of the space quadrature reference sources 80, 82 produce time quadrature waveforms of the type shown in FIG. 6. These waveforms differ up to the input terminals of bandpass filters 100 and 104, but are identical at the output terminals of the bandpass filters 100 and 104 by virtue of the Fourier theorem applied to the spatial convolutions transformed to equivalent temporal convolutions by time modulation. Time phase quadrature modulation drive signals are applied to reference sources 80 and 82 from a digital decoder 108 which is driven by a digital counter frequency divider 110. Clock pulses generated by a digital clock 112, for example a crystal oscillator, are applied to digital counter frequency divider 110. Absolute and differential reference source intensity variations are completely compensated by the resultant corresponding reference phase variations. For example, absolute intensity variations produce no phase shift of either reference or convolution waveforms and differential intensity variations produce identical phase shifts of both reference and convolution waveforms. Position readout variations due to differential phase shifts, which are caused by source intensity variations, are completely eliminated by the reference phases compensation. As a consequence of this inherent immunity to source intensity variations, phasor sensitivity to displacement can be increased with no sacrifice of stability by subtraction of a fraction of the analog reference signal from the analog convolution signal prior to the analog comparators shown in FIG. 3. This increase in phasor sensitivity to displacement can be readily appreciated by inspection of the phasor diagrams in FIGS. 6, 7 and 8.

From the foregoing, it will be appreciated that the present invention provides an electro-optical system for generating phase signals representing relative displacement between a master reticle with an aperture pattern in an object plane and a workpiece with a reflective pattern in an image plane. The image and object planes are separated by a distance of approximately twelve inches. A processor compares the phase of a signal generated by the convolution detector to the phase of a signal generated by the reference detector and generates data signals defining the relative displacement between the master reticle and the workpiece.

Since certain changes may be made in the foregoing description without departing from the scope of the invention herein involved, it is intended that all matter contained in the above description and depicted in the accompanying drawings be construed in an illustrative sense and not in a limiting sense.

What is claimed is:

1. An electro-optical device for generating data signals representing relative displacement between an aperture pattern on a master in an object plane and a reflective pattern on a workpiece in an image plane, said device comprising:
   (a) a reticle pattern in an object plane;
   (b) a reflective pattern in an image plane;
   (c) imaging means disposed in an optical path between said object plane and said image plane;
   (d) source means for generating reference radiation in at least two paths, said reference radiation directed towards the aperture pattern, and then towards said reflective pattern;
   (e) means for splitting said reference radiation;
   (f) reference detector means for sensing a first portion of said split reference radiation, said first portion directed directly towards said reference detector means;
   (g) convolution detector means for sensing a second portion of said reference radiation, said second portion reflected from the reflective pattern; and
   (h) processor means operatively connected to said reference detector means and said convolution detector means, said reference detector means and said convolution detector means generating signals having a phase relationship related to the relative displacement between the aperture pattern and the reflective pattern, said processor means comparing the phase of said signals generated by said reference detector means and said convolution detector means and generating data signals representing the relative displacement between the master and the workpiece.

2. The electro-optical device as claimed in claim 1 including beam lengthening means disposed in an optical path between said source means and the workpiece.

3. The electro-optical device as claimed in claim 1 wherein said source means includes first and second sources, said first and second sources positioned in convolution space quadrature with respect to their radiation spatial-convolution reference patterns, said first and second sources disposed in a plane normal to a longitudinal axis of said reference detector means and lie along a path normal to the object and image planes.

4. The electro-optical device as claimed in claim 3 wherein said means for splitting includes beam splitter means for reflecting a portion of said radiation generated by said first and second sources towards said reference detector means only and for transmitting a portion of said radiation towards the reflective pattern.

5. The electro-optical devices as claimed in claim 1 wherein said processor means includes first and second bandpass filters, first and second analog voltage comparators, and a phase comparator, said reference detector means output signal applied to said first bandpass filter, said first bandpass filter operating to filter out the DC and harmonic components of said reference detector means output signal, a signal presented at an output of said first bandpass filter applied to an input of said phase comparator via said first analog voltage comparator, said convolution detector means output signal applied to said second bandpass filter, said second bandpass filter operating to filter out the DC and harmonic components of said convolution detector means output signal, a signal presented at an output of said second bandpass filter applied to another input of said phase comparator via said second analog voltage comparator, said phase comparator generating a signal representing the relative displacement of the master and the workpiece.

6. An electro-optical device for generating data signals representing relative displacement between an optical aperture pattern on a master in an object plane and a reflective pattern on a workpiece in an image plane, the object plane parallel to the image plane, said device comprising:
   (a) a reticle pattern in an object plane;
   (b) a reflective pattern in an image plane;
   (c) imaging means disposed in an optical path between said object plane and said image plane;
   (d) first and second fixed reference source means for generating reference radiation in at least two paths;
   (e) beam lengthening means through which said reference radiation passes;
   (f) beam splitter means, said reference radiation passing through said beam lengthening means split into at least first and second portions by said beam splitter means;
   (g) reference detector means for sensing said first portion of said reference radiation;
   (h) convolution detector means for sensing said second portion of said reference radiation from the aperture pattern and reflected by the reflective pattern;
   (i) reflector means for reflecting said second portion of said radiation generated by said first and second fixed reference sources towards said convulation detector means; and
   (j) processor means operatively connected to said reference detector means, said reference detector means generating signals having a phase relationship related to the relative displacement between the aperture pattern and the reflective pattern, said processor means comparing the phase of said signals generated by said reference detector means and said convulation detector means and generating data signals representing the relative displacement of the master and the workpiece.

7. The electro-optical system as claimed in claim 6 wherein said imaging means includes lens means disposed in an optical path of said reference radiation between the master and the workpiece.

8. The electro-optical system as claimed in claim 6 wherein said first and second reference source means are positioned in convolution space quadrature with respect to their radiation spatial-convolution reference patterns, said first and second reference source means disposed in a plane normal to a longitudinal axis of said reference detector means and lie along a path normal to the aperture and reflective planes.

9. The electro-optical system as claimed in claim 7 including photographic means for imaging the aperture pattern on the workpiece.

10. The electro-optical device as claimed in claim 9 wherein said processor means includes first and second bandpass filters, first and second analog voltage comparators, and a phase comparator, said reference detector means output signal applied to said first bandpass filter, said first bandpass filter operating to filter out the DC and harmonic components of said reference detector means output signal, a signal presented at an output of said first bandpass filter applied to an input of said phase comparator via said first analog voltage comparator, said convolution detector means output signal applied to said second bandpass filter, said second bandpass filter operating to filter out the DC and harmonic components of said convolution detector means output signal, a signal presented at an output of said second bandpass filter applied to another input of said phase comparator via said second analog voltage comparator, said phase comparator generating a signal representing the relative displacement of the aperture pattern and the reflective pattern.

11. The electro-optical device as claimed in claim 1 wherein said imaging means includes lens means disposed in an optical path between said object plane and said image plane.

* * * * *